US012740472B2

(12) United States Patent
Park et al.

(10) Patent No.: US 12,740,472 B2
(45) Date of Patent: Sep. 15, 2026

(54) SEMICONDUCTOR DEVICE AND METHOD FOR MANUFACTURING THE SAME

(71) Applicant: SAMSUNG ELECTRONICS CO., LTD., Suwon-si (KR)

(72) Inventors: Gyuseong Park, Suwon-si (KR); Joongwon Shin, Suwon-si (KR); Jong-Min Lee, Suwon-si (KR); Jimin Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 364 days.

(21) Appl. No.: 18/459,111

(22) Filed: Aug. 31, 2023

(65) Prior Publication Data

US 2024/0290677 A1 Aug. 29, 2024

(30) Foreign Application Priority Data

Feb. 27, 2023 (KR) ........................ 10-2023-0025914

(51) Int. Cl.
*H10W 74/10* (2026.01)
*H10W 20/00* (2026.01)
(Continued)

(52) U.S. Cl.
CPC ....... *H10W 74/131* (2026.01); *H10W 20/071* (2026.01); *H10W 20/47* (2026.01);
(Continued)

(58) Field of Classification Search
CPC ................. H01L 23/3157; H01L 21/56; H01L 21/76801; H01L 23/3192; H01L 23/53295; H01L 23/291; H01L 2224/05567; H01L 2224/05571; H01L 2224/13021; H01L 2224/13082; H01L 23/562; H01L 24/05; H01L 24/13; H01L 21/762; H01L 23/528;
(Continued)

(56) References Cited

U.S. PATENT DOCUMENTS 6,245,883 B1 6/2001 Uu
6,630,402 B2 10/2003 Hshieh et al.
(Continued)

FOREIGN PATENT DOCUMENTS

JP 3330673 B 9/2002
KR 10-065239581 12/2006
(Continued)

*Primary Examiner* — Douglas W Owens
(74) *Attorney, Agent, or Firm* — MORGAN, LEWIS & BOCKIUS LLP

(57) ABSTRACT

A semiconductor device includes an interlayer insulating layer, a first protective insulating layer on the interlayer insulating layer, a second protective insulating layer on the first protective insulating layer, and insulating structures disposed in at least one of the first protective insulating layer or the second protective insulating layer, wherein the insulating structures include a first insulating structure including a first material having a first physical property, and a second insulating structure including a second material having a second physical property, and the first material and the second material include a same material, and the first physical property and the second physical property are different physical properties.

15 Claims, 25 Drawing Sheets

(51) Int. Cl.

| | |
|---|---|
| ***H10W 20/47*** | (2026.01) |
| ***H10W 72/20*** | (2026.01) |
| ***H10W 72/90*** | (2026.01) |
| ***H10W 74/01*** | (2026.01) |
| ***H10W 74/43*** | (2026.01) |

(52) U.S. Cl.
CPC ......... *H10W 74/01* (2026.01); *H10W 74/147* (2026.01); *H10W 72/222* (2026.01); *H10W 72/242* (2026.01); *H10W 72/252* (2026.01); *H10W 72/253* (2026.01); *H10W 72/9415* (2026.01); *H10W 72/952* (2026.01); *H10W 72/953* (2026.01); *H10W 74/43* (2026.01)

(58) Field of Classification Search
CPC ........ H01L 21/02123; H01L 21/76267; H10D 86/01; H10W 74/131; H10W 20/071; H10W 20/47; H10W 74/01; H10W 74/147; H10W 72/222; H10W 72/242; H10W 72/252; H10W 72/253; H10W 72/9415; H10W 72/952; H10W 72/953; H10W 74/43; H10W 72/90; H10W 42/121; H10W 72/20; H10W 10/011; H10W 10/10; H10W 20/43; H10P 14/6903; H10P 90/1908
See application file for complete search history.

(56) References Cited

U.S. PATENT DOCUMENTS

| | | | | |
|---|---|---|---|---|
| 7,781,851 | B2 | 8/2010 | Seo | |
| 8,918,988 | B2 | 12/2014 | Fayaz et al. | |
| 9,064,702 | B2 | 6/2015 | Brunco et al. | |
| 9,472,508 | B2 | 10/2016 | Lin et al. | |
| 9,818,704 | B2 | 11/2017 | Wang et al. | |
| 2006/0163689 | A1 | 7/2006 | Seo | |
| 2010/0285654 | A1 | 11/2010 | Seo | |
| 2011/0049723 | A1 | 3/2011 | Maxson et al. | |
| 2014/0187037 | A1* | 7/2014 | Rho | H10W 10/021<br>438/626 |
| 2020/0126930 | A1* | 4/2020 | Cho | H10W 42/121 |
| 2024/0258177 | A1* | 8/2024 | Hsiao | H10P 74/203 |
| 2024/0341086 | A1* | 10/2024 | Lee | H10B 12/482 |

FOREIGN PATENT DOCUMENTS

| | | | |
|---|---|---|---|
| KR | 10-2011-0078064 | A | 7/2011 |
| KR | 10-2021-0121999 | A | 10/2021 |

* cited by examiner

SEMICONDUCTOR DEVICE AND METHOD FOR MANUFACTURING THE SAME

CROSS-REFERENCE TO RELATED APPLICATION

This application claims priority under 35 U.S.C. § 119 to Korean Patent Application No. 10-2023-0025914, filed in the Korean Intellectual Property Office on Feb. 27, 2023, the entire contents of which are incorporated by reference herein.

BACKGROUND

(a) Technical Field

The present disclosure relates to a semiconductor device and a method for manufacturing the same.

(b) Discussion of Related Art

With the demands for smaller and lighter electronic devices, the semiconductor industry has been seeking to make semiconductor devices that may be mounted in electronic devices smaller, lighter, and thinner while making the semiconductor devices have higher computational speed, more functions, and higher capacity. Stacked semiconductor devices (for example, High Bandwidth Memory (HBM)) are a proposed technology for achieving one or more of these characteristics. The stacked semiconductor devices are formed by stacking individual semiconductor chips. The stacked semiconductor devices may be able to store more data and transmit data at higher rate than conventional semiconductor chips.

Stacked semiconductor devices may be manufactured by coupling semiconductor chips, which may be performed at the level of a wafer, for example, with wafer-level stacking. The stacked semiconductor devices, which may be disposed at different positions on a wafer, may be sensitive to warpage of the wafers. Warpage of the wafer may be caused by compressive stress or tensile stress applied to the wafer. The positions on a wafer to which compressive stress is applied and the positions on the wafer to which tensile stress is applied may be different from each other due to various factors. In this case, the warpage may vary depending on the position of a chip on the wafer.

When warpage of the wafer is severe, defects may occur in thin films, so it may become difficult to couple semiconductor chips. Representative thin-film defects include delamination of thin films, generation of cracks in thin films, buckling of some parts of thin films, and wrinkling of thin films.

SUMMARY

The present disclosure attempts to provide a semiconductor device that includes insulating structures in a first protective insulating layer formed on an interlayer insulating layer or a second protective insulating layer formed on the first protective insulating layer, wherein the insulating structures contain a first material or a second material, and the first material and the second material contain a same material having different physical properties, and a method for manufacturing the semiconductor device.

A semiconductor device according to an embodiment includes an interlayer insulating layer, a first protective insulating layer on the interlayer insulating layer, a second protective insulating layer on the first protective insulating layer, and a plurality of insulating structures disposed in at least one of the first protective insulating layer or the second protective insulating layer, wherein the plurality of insulating structures comprise a first insulating structure comprising a first material having a first physical property, and a second insulating structure comprising a second material having a second physical property, wherein the first material and the second material comprise a same material, and the first physical property and the second physical property are different physical properties.

The interlayer insulating layer may be on a substrate.

The first material may have a tensile residual stress greater than a tensile residual of the second material.

The first material may have a density greater than a density of the second material.

The first material and the second material may comprise a silicon nitride or a silicon oxide.

The plurality of insulating structures are disposed in the first protective insulating layer and may extend from a lower surface of the second protective insulating layer.

The plurality of insulating structures are disposed in the second protective insulating layer and may have a same thickness as a thickness of the second protective insulating layer.

A semiconductor device according to another embodiment may include a substrate, an interlayer insulating layer on the substrate, a plurality of wiring lines disposed in the interlayer insulating layer, a mask layer on the interlayer insulating layer, conductive pad in the mask layer, a plurality of contact plugs connecting the plurality of wiring lines and the conductive pad, a first protective insulating layer on the mask layer, a second protective insulating layer on the first protective insulating layer, a plurality of insulating structures disposed in at least one of the first protective insulating layer or the second protective insulating layer, and a bump structure on the second protective insulating layer, wherein the plurality of insulating structures comprise a first insulating structure comprising a first material having a first physical property, and a second insulating structure comprising a second material having a second physical property, and the first material and the second material comprise a same material and the first physical property and the second physical property are different physical properties, and a thickness of the conductive pad is greater than a thickness of each wiring line of the plurality of wiring lines, and the bump structure is in contact with the conductive pad through the first protective insulating layer and the second protective insulating layer.

The thickness of the conductive pad may be between about two to 100 times the thickness of the wiring line, and the thickness of the conductive pad is between about 1 μm to 5 μm. At least one of the mask layer or the first protective insulating layer may comprise tetraethyl orthosilicate (TEOS). The second protective insulating layer may comprise a silicon nitride.

The conductive pad may comprise aluminum, and the plurality of wiring lines may comprise copper.

In a plan view, the first insulating structure and the second insulating structure may have shapes surrounding at least a portion of a periphery of the conductive pad.

The first material may have a tensile residual stress greater than a tensile residual stress of the second material.

The first material and the second material may comprise a silicon nitride or a silicon oxide.

A method for manufacturing a semiconductor device according to yet another embodiment may include forming a plurality of conductive pads on an interlayer insulating layer formed on a wafer, depositing a first protective insulating layer on the plurality of conductive pads, depositing a second protective insulating layer on the first protective insulating layer, forming a plurality of patterns in at least one of the first protective insulating layer or the second protective insulating layer, and tuning a warpage value of the wafer by filling at least a first pattern of the plurality of patterns with a first material and filling at least a second pattern of the plurality of patterns with a second material, wherein the first material and the second material are a same material and the first material has a different physical property than the second material.

The method for manufacturing the semiconductor device may further include forming a plurality of bump structures on the second protective insulating layer.

In the step of tuning a warpage value of the wafer, the first material may be filled at a first chamber pressure and the second material may be filled at a second chamber pressure, wherein the first chamber pressure may be greater than the second chamber pressure.

The first material may be a first silicon oxide formed using a first compressive TEOS gas, and the second material may be a second silicon oxide formed using a second compressive TEOS gas, and a flow rate of the first compressive TEOS gas may be greater than the flow rate of the second compressive TEOS gas.

In the step of tuning a warpage value of the wafer by filling at least a first pattern of the plurality of patterns with the first material and filling at least a second pattern of the plurality of patterns with the second material, the patterns in a position on the wafer having a warpage value indicating that the wafer warps upward may be filled with the first material, and the patterns in a position on the wafer having a warpage value indicating that the wafer warps downward may be filled with the second material.

According to an embodiment, in a semiconductor device, insulating structures comprising a first material or a second material are disposed in a first protective insulating layer formed on an interlayer insulating layer or in a second protective insulating layer formed on the first protective insulating layer, whereby a warpage value of the wafer at different positions on a wafer can be finely adjusted to reduce or control warpage of the wafer.

DETAILED DESCRIPTION

Figure 1:
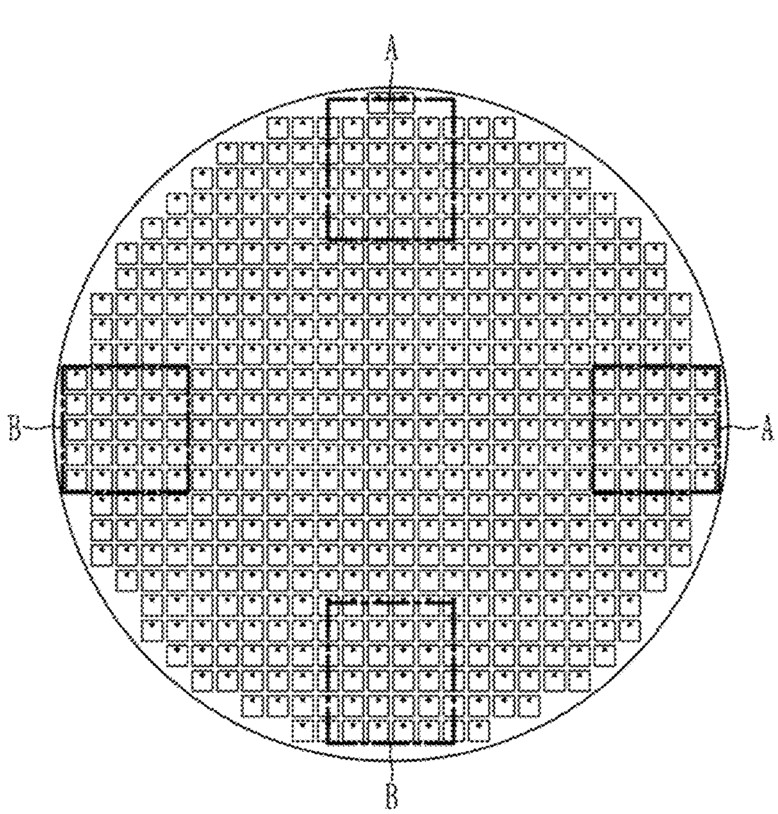
FIG. 1 is a drawing illustrating that warpage value may vary depending on the position on a wafer.

In the following detailed description, embodiments of the present disclosure have been shown and described by way of illustration. The present disclosure can be variously implemented and is not limited to embodiments described herein.

The drawings and description are to be regarded as illustrative in nature and not restrictive. Like reference numerals designate like elements throughout the specification.

In addition, the size and thickness of each configuration shown in the drawings are arbitrarily shown for understanding and ease of description, but the present disclosure is not limited thereto.

Throughout this specification, when a part is referred to as being "connected" to another part, it may be directly connected to the other part, or may be connected to the other part indirectly with any other elements interposed therebetween. In addition, unless explicitly described to the contrary, the word "comprise", and variations such as "comprises" or "comprising", will be understood to imply the inclusion of stated elements but not the exclusion of any other elements.

Further, it will be understood that when an element such as a layer, film, region, or substrate is referred to as being "on" another element, it can be directly on the other element or intervening elements may also be present. In contrast, when an element is referred to as being "directly on" another element, there are no intervening elements present. Further, when an element is "above" or "on" a reference portion, the element is located above or below the reference portion, and it does not necessarily mean that the element is located "above" or "on" in a direction opposite to gravity.

Further, in the entire specification, when it is referred to as "on a plane", it means when a target part is viewed from above, and when it is referred to as "on a cross-section", it means when the cross-section obtained by cutting a target part vertically is viewed from the side.

Hereinafter, a semiconductor device and a method for manufacturing the semiconductor device according to an embodiment are described with reference to the drawings.

FIG. 1 is a drawing illustrating that warpage value may vary depending on the position on a wafer.

Wafer warpage may be affected by intrinsic factors that form thin films, such as the composition ratios of thin films stacked on wafers, expansion or contraction due to crystal grain growth, thin-film deposition conditions (such as temperature, pressure, RF conditions, and gas flow rates), etc. Wafer warpage may be caused by compressive stress or tensile stress applied to wafers, which may depend on the intrinsic factors.

Referring to FIG. 1, there may be a plurality of positions on a wafer, for example, positions A and positions B. When factors acting on thin films at positions A have attributes opposite to the attributes of factors acting on thin films at positions B, compressive stress and tensile stress may be applied to the thin films at positions A and the thin films at positions B, respectively, or tensile stress and compressive stress may be applied to the thin films at positions A and the thin films at positions B, respectively. The wafer may warp as a result of the compressive stress and tensile stress. The warpage may be measured at positions A and positions B. The warpage at positions A and positions B may be different.

According to some embodiments, wafer warpage, which may depend on the position on a wafer, may be adjusted. By adjusting wafer warpage at different positions, it may be possible to reduce thin-film defects which may occur on wafers, and increase the production yield of stacked semiconductor devices. According to some embodiments, in a method for manufacturing stacked semiconductor devices on a wafer, warpage of the wafer may be finely adjusted depending the position on the wafer.

Figure 2:
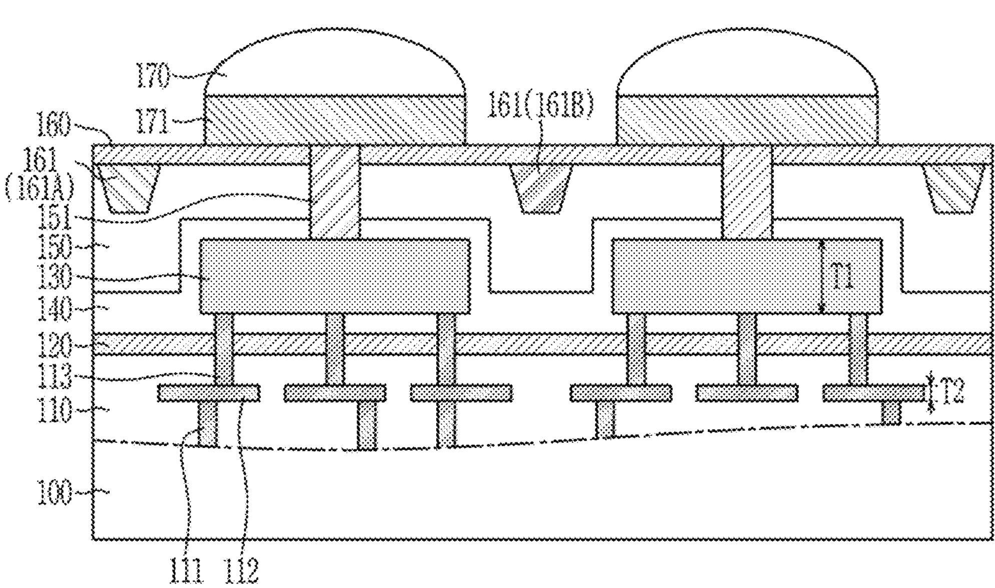
FIG. 2 is a cross-sectional view illustrating a semiconductor device including insulating structures in a first protective insulating layer.

FIG. 2 is a cross-sectional view illustrating a semiconductor device, which may include insulating structures 161 formed in a first protective insulating layer 150. Each of the insulating structures 161 may comprise a first material 161A or a second material 161B.

Figure 3:
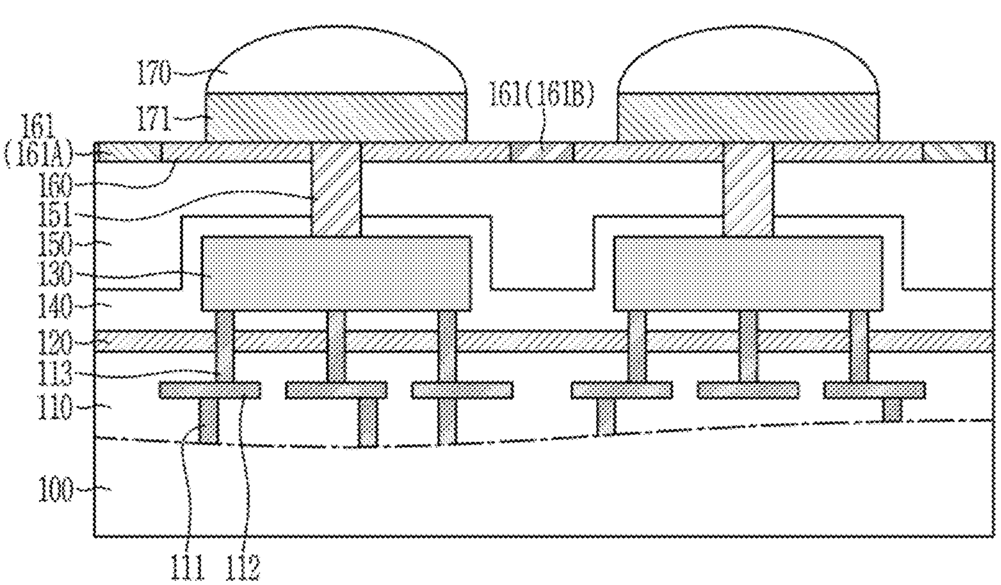
FIG. 3 is a cross-sectional view illustrating a semiconductor device including insulating structures in a second protective insulating layer.

Referring to FIG. 2 and FIG. 3, the semiconductor device may include a first interlayer insulating layer 110, first contact plugs 111, intermediate wiring lines 112, second contact plugs 113, a second interlayer insulating layer 120, conductive pads 130, a mask layer 140, the first protective insulating layer 150, third contact plugs 151, a second protective insulating layer 160, the insulating structures 161, bump filler structures 171, and bump solder 170.

The first interlayer insulating layer 110 and the second interlayer insulating layer 120 may be sequentially disposed on a substrate 100. For example, the first interlayer insulating layer 110 may be disposed on the substrate 100 and the second interlayer insulating layer 120 may be disposed on the first interlayer insulating layer 110. A configuration beneath the first interlayer insulating layer 110 is not shown in the drawings. In the first interlayer insulating layer 110 and the second interlayer insulating layer 120, the first contact plugs 111, the intermediate wiring lines 112, and the second contact plugs 113 may be disposed.

The first contact plug 111 may be disposed between a lower wiring line (not shown in the drawings) and the intermediate wiring line 112. The first contact plug 111 may electrically couple the lower wiring line and the intermediate wiring line 112. The first contact plug 111 may electrically couple the lower wiring line and the intermediate wiring line 112 together in a vertical direction. The intermediate wiring line112 may be disposed between the first contact plug 111 and the second contact plug 113. The intermediate wiring line 112 may electrically couple the first contact plug 111 and the second contact plug 113 together. The intermediate wiring line112 may electrically couple the first contact plug 111 and the second contact plug 113 together in a horizontal direction, perpendicular to the vertical direction. The second contact plug 113 may be disposed between the intermediate wiring line 112 and the conductive pad 130. The second contact plug 113 may electrically couple the intermediate wiring line 112 and the conductive pad 130 together. The second contact plug 113 may electrically couple the intermediate wiring line 112 and the conductive pad 130 together in the vertical direction. In an embodiment, a diameter (width) of the second contact plug 113 may be larger than a diameter (width) of the first contact plug 111.

In an embodiment, the first interlayer insulating layer 110 may include, for example, a silicon dioxide ($SiO_2$) layer, a silicon oxycarbide (SiOC) layer, a silanol (SiOH) layer, an organosilicate (SiOCH) layer, or a low-k dielectric layer. In an embodiment, the second interlayer insulating layer 120 may contain, for example, silicon nitride (SiN), silicon carbon nitride (SiCN), or silicon oxynitride (SiON). In an embodiment, the first contact plugs 111, the intermediate wiring lines 112, and the second contact plugs 113 each may contain, for example, aluminum (Al), copper (Cu), tin (Sn), nickel (Ni), gold (Au), platinum (Pt), tungsten (W), or an alloy thereof.

The mask layer 140, the first protective insulating layer 150, and the second protective insulating layer 160 may be sequentially disposed on the second interlayer insulating layer 120. The conductive pads 130 may be disposed in the mask layer 140. In an embodiment, the mask layer 140 may cover surfaces of the conductive pads 130. An upper surface of the mask layer 140 may conform to the conductive pads 130. In an embodiment, the mask layer 140 may be in contact with at least one of a lower surface, a side surface, or the upper surface of the conductive pads 130. In another embodiment, the lower surface of the conductive pads 130 may be disposed in direct contact with an upper surface of the second interlayer insulating layer 120. In an embodiment, the mask layer 140 may comprise silicon oxide. In an embodiment, the mask layer 140 may comprise tetraethyl orthosilicate (TEOS). The material of the mask layer 140 is not limited thereto, and may include various materials.

The conductive pad 130 may be formed having a thickness greater than a thickness of the wiring line included in the interlayer insulating layer. The conductive pad 130 may have one or more functions, including reducing deviations of a surface topography of an interface between individual semiconductor chips that may be coupled in a stacked semiconductor device, reducing an interconnection resistance of the stacked semiconductor device, or enhancing a drive capability of current. In an embodiment, the thickness T1 of the conductive pad 130 may be between about 1 μm to 5 μm. In an embodiment, the thickness T1 of the conductive pad 130 may be about two to 100 times the thickness T2 of the intermediate wiring line 112. In an embodiment, the conductive pad 130 may comprise, for example, Al, Cu, Ni, cobalt (Co), silver (Ag), Pt, ruthenium (Ru), W, tungsten nitride (WN), titanium (Ti), titanium nitride (TiN), tantalum (Ta), tantalum nitride (TaN), or a combination thereof.

The first protective insulating layer 150 may be disposed on the mask layer 140. In an embodiment, the first protective insulating layer 150 may comprise silicon oxide. In an embodiment, the first protective insulating layer 150 may comprise tetraethyl orthosilicate (TEOS). That is, the first protective insulating layer 150 may be formed from a compressive TEOS gas, for example. The material of the first protective insulating layer 150 is not limited thereto, and the first protective insulating layer 150 may include various materials.

The insulating structures 161 may be formed of a material that may have different physical properties, for example, depending on process conditions when the material is deposited or formed. For example, a first material may have a first physical property that is different than a second physical property of a second material, while the first material and the second material may be a same material. For example, the first material and the second material may be a silicon nitride, and the first material may have a density greater than a density of the second material, or the first material may have a tensile residual stress greater than a tensile residual stress of the second material. In another example, the first material and the second material may be a silicon oxide, and the first material may have a density greater than a density of the second material, or the first material may have a tensile residual stress greater than a tensile residual stress of the second material.

Referring to FIG. 2, the first protective insulating layer 150 may comprise the insulating structures 161. The insulating structures 161 may extend downward from an upper surface of the first protective insulating layer 150. The insulating structures 161 may extend downward from a lower surface of the second protective insulating layer 160.

Referring to FIG. 2 and FIG. 3, in a plan view, the insulating structure 161 may have shape surrounding at least a portion of peripheries of the conductive pad 130. In an embodiment, the insulating structures 161 may be located between the conductive pads 130 in the horizonal direction. In an embodiment, cross sections of the insulating structure 161 may have a triangular, rectangular, trapezoidal, circular, elliptical, polygonal, or elongated shape. The cross section shape of the insulating structure 161 is not limited thereto, and the insulating structure 161 may be variously formed. For example, the insulating structure 161 may be variously formed in view of a layout and arrangement of the conductive pad 130, the mask layer 140, the first protective insulating layer 150, and the bump filler structure 171, and wafer warpage.

The insulating structures 161 may comprise the first material 161A or the second material 161B. In an embodiment, the first material 161A and the second material 161B may comprise silicon nitride. In an embodiment, the first material 161A may be high compressive silicon nitride, and the second material 161B may be low compressive silicon nitride. The high compressive silicon nitride may have a density greater than a density of the silicon nitride of the second protective insulating layer 160, and the low compressive silicon nitride may have a density less than the density of the silicon nitride of the second protective insulating layer 160. Further, the high compressive silicon nitride may have a tensile residual stress greater than a tensile residual stress of the silicon nitride of the second protective insulating layer 160, and the low compressive silicon nitride may have a tensile residual stress less than the tensile residual stress of the silicon nitride of the second protective insulating layer 160.

Since a tensile residual stress of a high compressive silicon nitride increases in a negative direction, the high compressive silicon nitride has a warpage property of warping downward, that is, a negative warpage value. By including patterns of the high compressive silicon nitride in positions on the wafer exhibiting a warpage property of warping upward, the warpage property of the wafer may be adjusted. Since a tensile residual stress of a low compressive silicon nitride increases in the positive direction, the low compressive silicon nitride has a warpage property of warping upward, that is, a positive warpage value. By including patterns of the low compressive silicon nitride in positions on the wafer exhibiting a warpage property of warping downward, the warpage property of the wafer may be adjusted. In an embodiment, physical properties of the wafer at different positions may be tuned according to positions of high compressive silicon nitride structures and low compressive silicon nitride.

Referring to FIG. 2 and FIG. 3, the first material 161A, which is the high compressive silicon nitride, may be used in a left insulating structure and a right insulating structure, and the second material 161B, which is the low compressive silicon nitride, may be used in a middle insulating structure. The insulating structures 161 of the high compressive silicon nitride may be disposed on the left side and right side of the wafer, which may exhibit positive warpage values, and the insulating structure 161 of the low compressive silicon nitride may be disposed at the center, which may exhibit a negative warpage value. The high compressive silicon nitride or the low compressive silicon nitride may be disposed in the insulating structures 161 depending on a warpage tendency of the wafer.

In an embodiment, the first material 161A and the second material 161B may comprise silicon oxide. In an embodiment, the first material 161A may be a high compressive silicon oxide, and the second material 161B may be a low compressive silicon oxide. The high compressive silicon oxide may have a tensile residual stress greater than a tensile residual stress of the low compressive silicon oxide. Referring to the warpage properties of the high compressive silicon oxide and the low compressive silicon oxide, the warpage properties of the high compressive silicon nitride and the low compressive silicon nitride may be applied in the same way. In an embodiment, local mechanical properties of the wafer may be tuned according to positions of high compressive silicon oxide structures and low compressive silicon oxide.

Referring to FIG. 2, the insulating structures 161 may be disposed on the first protective insulating layer 150. The insulating structures 161 may be disposed in the first protective insulating layer 150. The second protective insulating layer 160 may be disposed on the first protective insulating layer 150. The second protective insulating layer 160 may be disposed on the first protective insulating layer 150 and the insulating structures 161.

Referring to FIG. 2 and FIG. 3, in an embodiment, the second protective insulating layer 160 may comprise silicon nitride. The second protective insulating layer 160 is not limited thereto, and the second protective insulating layer 160 may comprise other materials.

A bump structure including the bump filler structure 171 and the bump solder 170 may be disposed on the second protective insulating layer 160. The bump filler structure 171 may be electrically coupled to the conductive pad 130 by the third contact plug 151. The third contact plug 151 may penetrate through the mask layer 140, the first protective insulating layer 150, and the second protective insulating layer 160. In an embodiment, the third contact plug 151 may be formed integrally with the bump filler structure 171. For example, the third contact plug 151 and the bump filler structure 171 may be formed during a single deposition of a material.

In an embodiment, the bump filler structure 171 may comprise, for example, Ni, Cu, Al, Ag, Pt, Ru, Sn, Au, W, WN, Ti, TiN, Ta, TaN, or a combination thereof. In an embodiment, the bump solder 170 may comprise, for example, Sn, Ag, Cu, Ni, Au, or a combination thereof. In an embodiment, the bump solder 170 may include, for example, a Sn—Ag—Cu layer. The third contact plugs 151 may contain, for example, Al, Cu, Sn, Ni, Au, Pt, W, or an alloy thereof.

FIG. 3 is a cross-sectional view illustrating a semiconductor device including the insulating structures 161, which may be disposed in the second protective insulating layer 160.

Referring to FIG. 3, the insulating structures 161 may be disposed in the second protective insulating layer 160. The insulating structures 161 may have a same thickness as a thickness of the second protective insulating layer 160. For example, upper surfaces of the second protective insulating layer 160 and the insulating structures 161 may be coplanar, and lower surfaces of the second protective insulating layer 160 and the insulating structures 161 may be coplanar. In a plan view, the insulating structure 161 may have shapes surrounding at least a portion of the periphery of the conductive pad 130.

In an embodiment of FIG. 2, the insulating structures 161 may be disposed in the first protective insulating layer 150. In an embodiment of FIG. 3, the insulating structures 161 may be disposed in the second protective insulating layer 160. However, in other embodiments, insulating structures 161 may be disposed in both of the first protective insulating layer 150 and the second protective insulating layer 160. For example, the insulating structures 161 may penetrate the first protective insulating layer 150 and the second protective insulating layer 160.

According to embodiments of FIG. 2 and FIG. 3, through various combinations of disposing the insulating structures 161 in at least one of the first protective insulating layer 150 or the second protective insulating layer 160, forming the insulating structures 161 in various shapes, disposing a high compressive silicon material or a low compressive silicon material in the insulating structures 161, and disposing silicon nitride or silicon oxide in the insulating structures 161, the warpage at local positions of wafers can be finely adjusted.

Figure 4:
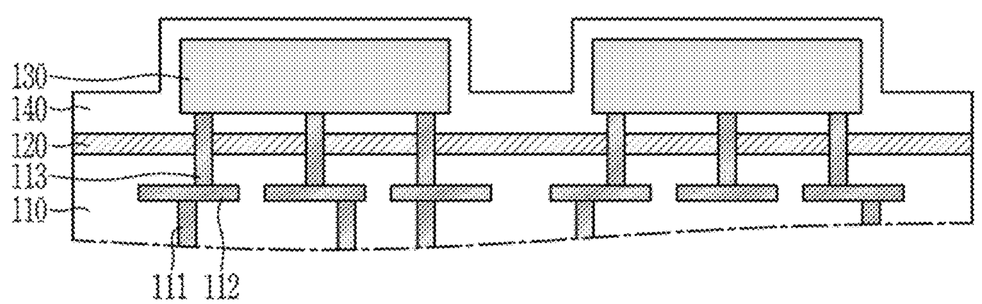
FIG. 4 is a cross-sectional view illustrating a step of depositing a mask layer on conductive pads.

While the thicknesses of thin films corresponding to the second protective insulating layer may be changed to adjust the warpage of wafers, if the thickness of the second protective insulating layer 160 decreases, color difference defects may occur, and if the thickness of the second protective insulating layer 160 increases, the thermal properties of the semiconductor device may deteriorate. Embodiments according to this disclosure can adjust the warpage of the wafer without a change in the thickness of the second protective insulating layer 160. In some embodiments, the insulating structures 161 may be arranged to adjust warpage of wafers and prevent color difference defects that may occur when the thickness of the second protective insulating layer 160 is changed to adjust warpage of wafers. FIG. 4 is a cross-sectional view illustrating a step of depositing the mask layer 140 on the conductive pads 130.

Referring to FIG. 4, the mask layer 140 may be formed on the side surface and the upper surface of the conductive pad 130. The mask layer 140 may conform to the side surface and the upper surface of the conductive pad 130. In an embodiment, the mask layer 140 may be formed by, for example, a thermal CVD process, a plasma-enhanced CVD process, or an atomic layer deposition (ALD) process.

Figure 5:
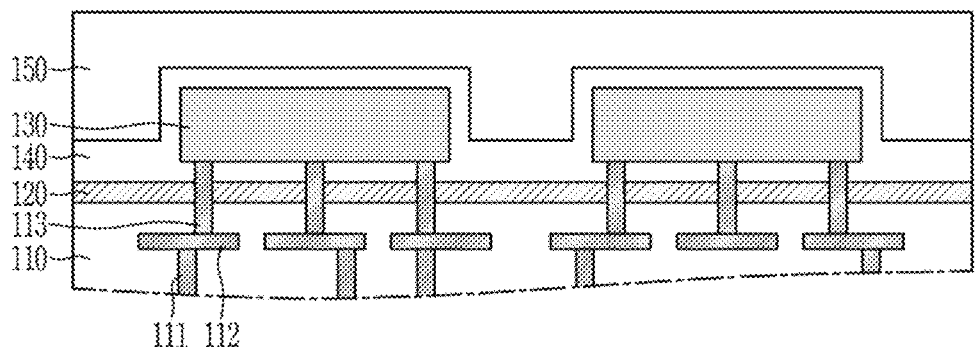
FIG. 5 is a cross-sectional view illustrating a step of depositing a first protective insulating layer on the mask layer.

FIG. 5 is a cross-sectional view illustrating a step of depositing the first protective insulating layer 150 on the mask layer 140.

Referring to FIG. 5, the first protective insulating layer 150 may be formed on the mask layer 140. In an embodiment, the first protective insulating layer 150 may be formed by, for example, a thermal CVD process, a plasma-enhanced CVD process, or an atomic layer deposition (ALD) process.

FIG. 6 to FIG. 15 are cross-sectional views illustrating a method for manufacturing the semiconductor device of an embodiment of FIG. 2.

Figure 6:
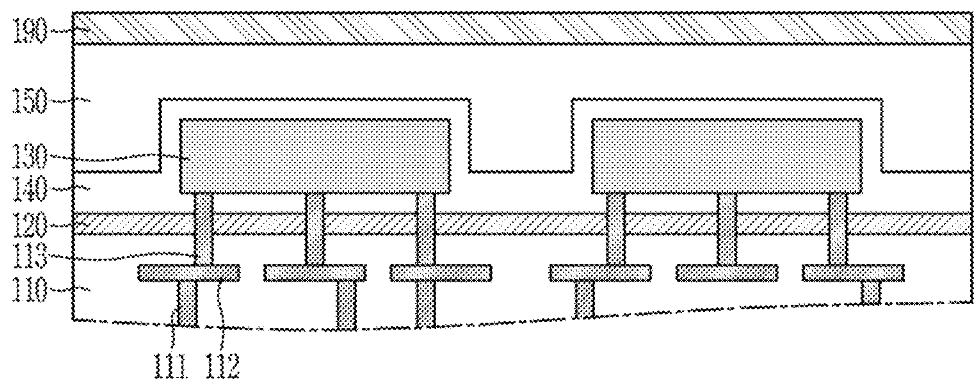
FIG. 6, FIG. 7, FIG. 8, FIG. 9, FIG. 10, FIG. 11, FIG. 12, FIG. 13, FIG. 14, and FIG. 15 are cross-sectional views illustrating the method for manufacturing the semiconductor device of an embodiment of FIG. 2.

FIG. 6 is a cross-sectional view illustrating a step of coating the upper surface of the first protective insulating layer 150 with a photoresist 190.

Referring to FIG. 6, the upper surface of the first protective insulating layer 150 may be coated with a photoresist 190. In an embodiment, the photoresist 190 may be formed by spin coating, for example. In an embodiment, the photoresist 190 may comprise an organic polymer resin containing a photoactive material.

Figure 7:
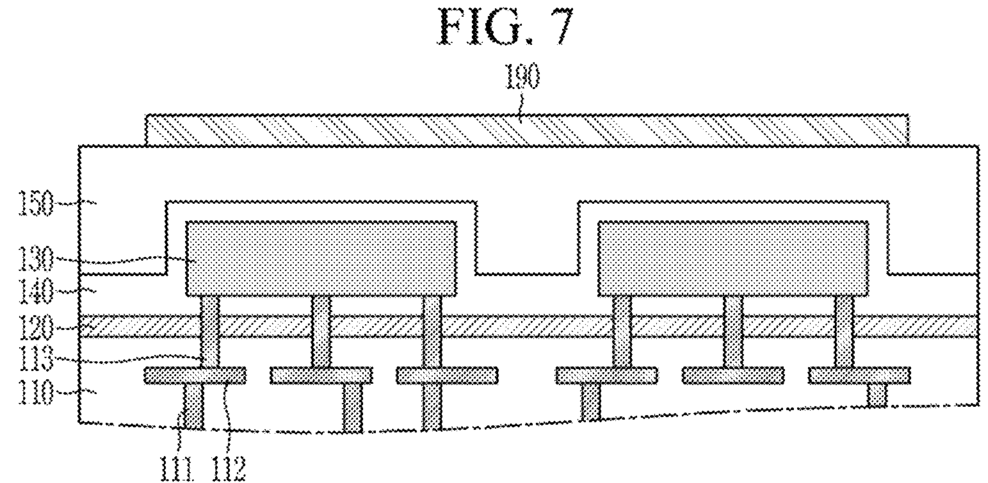

FIG. 7 is a cross-sectional view illustrating a step of patterning the photoresist 190.

Referring to FIG. 7, the photoresist 190 may be patterned by exposing and developing the photoresist 190. For example, the photoresist 190 may be patterned in view of a warpage value of the wafer.

Figure 8:
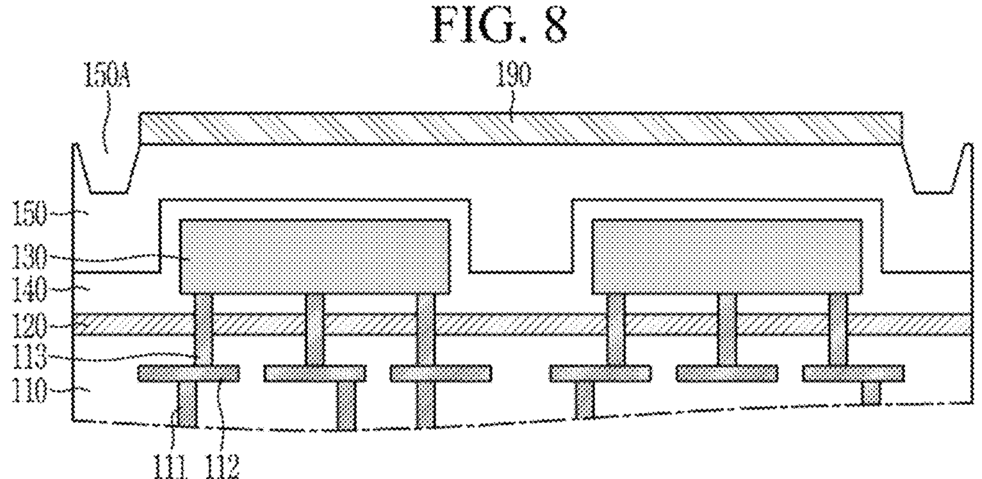

FIG. 8 is a cross-sectional view illustrating a step of etching some parts of the first protective insulating layer 150.

Referring to FIG. 8, the first protective insulating layer 150 may be etched using the photoresist (190) pattern as an etch mask. The etching may form recesses 150A in the first protective insulating layer 150.

Figure 9:
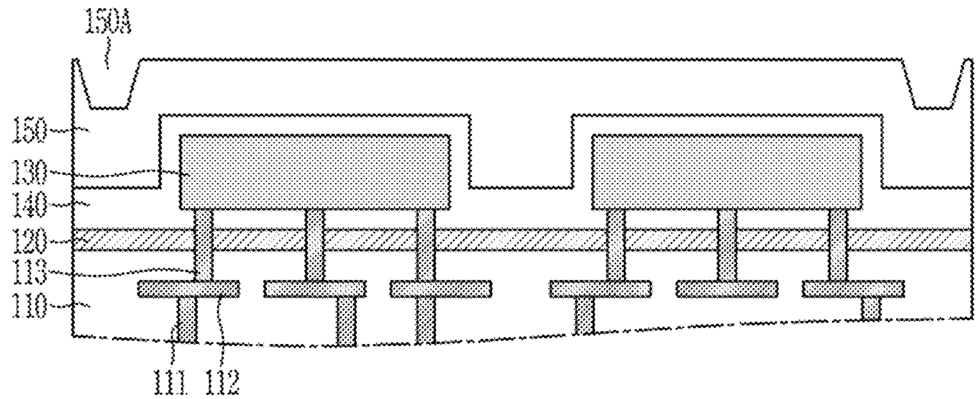

FIG. 9 is a cross-sectional view illustrating a step of removing the photoresist (190) pattern.

Referring to FIG. 9. the photoresist (190) pattern may be removed from the first protective insulating layer 150. The photoresist (190) pattern may be removed from the first protective insulating layer 150 by ashing and stripping.

Figure 10:
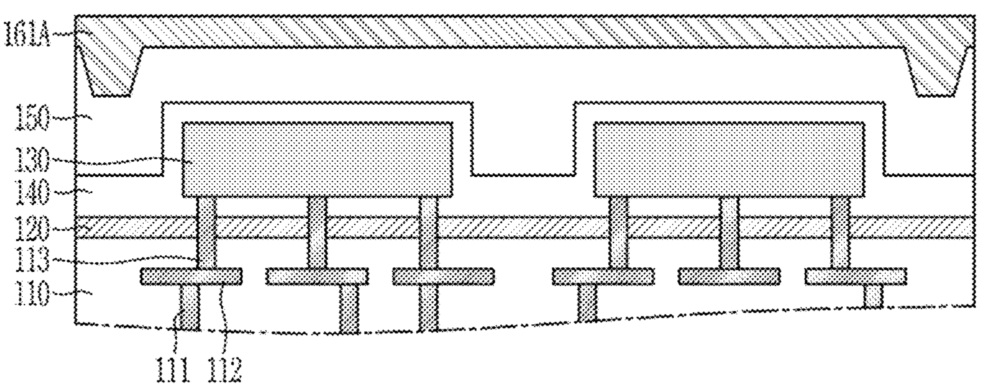

FIG. 10 is a cross-sectional view illustrating a step of depositing the first material 161A in the recesses 150A formed in the first protective insulating layer 150.

Referring to FIG. 10, the warpage value of the wafer measured at the positions where the recesses 150A are formed in the first protective insulating layer 150 may be positive. At this position, the wafer may exhibit a warpage property of warping upward. In an embodiment, the first material 161A may be high compressive silicon nitride. The high compressive silicon nitride may be formed by increasing the flow rates of reaction gases $SiH_4$ and $NH_3$ or reaction gases $SiH_2Cl_2$ and $NH_3$ in a chamber and increasing the pressure in the chamber (chamber pressure). If the flow rates of the reaction gases are increased and the pressure in the chamber is increased, when the high compressive silicon nitride is formed, spacing between molecules, which may be affected by the N—H bonds and the Si—H bonds, and may be decreased and the high compressive silicon nitride may be formed. As a result, the tensile residual stress and density of the silicon nitride may be significantly increased, and the high compressive silicon nitride may be formed.

In another embodiment, the first material 161A may be high compressive silicon oxide. In this case, the high compressive silicon may be is formed by increasing the flow rates of reaction gases TEOS and $O_2$ in a chamber and increasing the pressure in the chamber. As a result, the tensile residual stress of the high compressive silicon oxide may be significantly increased.

Since the tensile residual stress of the high compressive silicon nitride or the high compressive silicon oxide may be increased in the negative direction, the high compressive silicon nitride or the high compressive silicon oxide may have a warpage property of warping downward, that is, a negative warpage value. By including patterns of the high compressive silicon nitride or the high compressive silicon oxide at one or more of the positions of the wafer where the warpage value is positive, the warpage property of the wafer can be adjusted.

Figure 11:
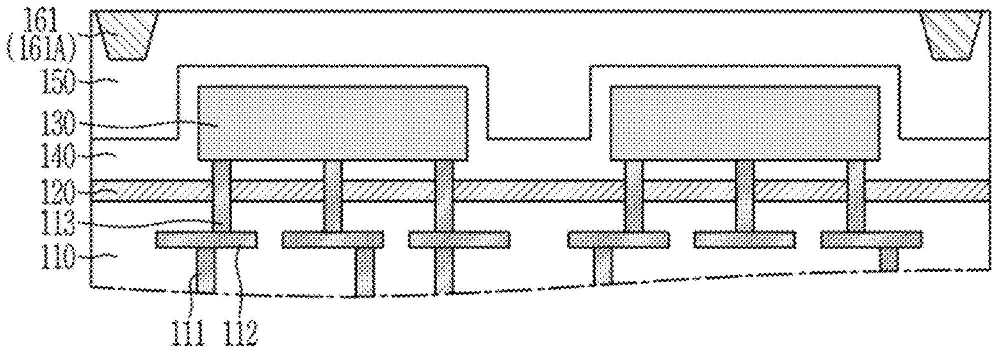

FIG. 11 is a cross-sectional view illustrating a step of performing a chemical mechanical planarization (CMP) process on the first material 161A.

Referring to FIG. 11, excess first material 161A on the first protective insulating layer 150 may be removed and planarized, for example, by applying a CMP process or a mechanical grinding process. For example, an upper surfaces of the first material 161A and the first protective insulating layer 150 may be coplanar following planarization.

Figure 12:
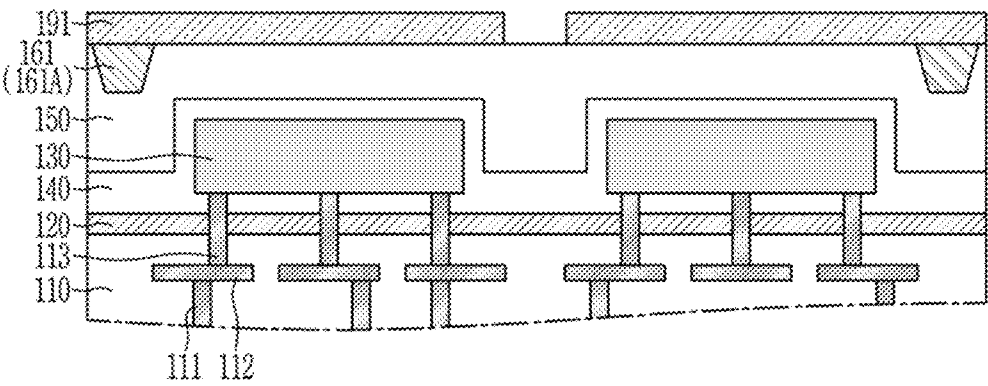

FIG. 12 is a cross-sectional view illustrating a step of coating the upper surface of the first protective insulating layer 150 with a photoresist 191 and patterning the photoresist.

Referring to FIG. 12, the upper surface of the first protective insulating layer 150 may be coated with the photoresist 191. The photoresist 191 may be patterned by exposing and developing the photoresist 191. The photoresist 191 may be patterned in view of the warpage value of the wafer. In an embodiment, the photoresist 191 may be formed by spin coating, for example. In an embodiment, the photoresist 191 may comprise an organic polymer resin containing a photoactive material.

Figure 13:
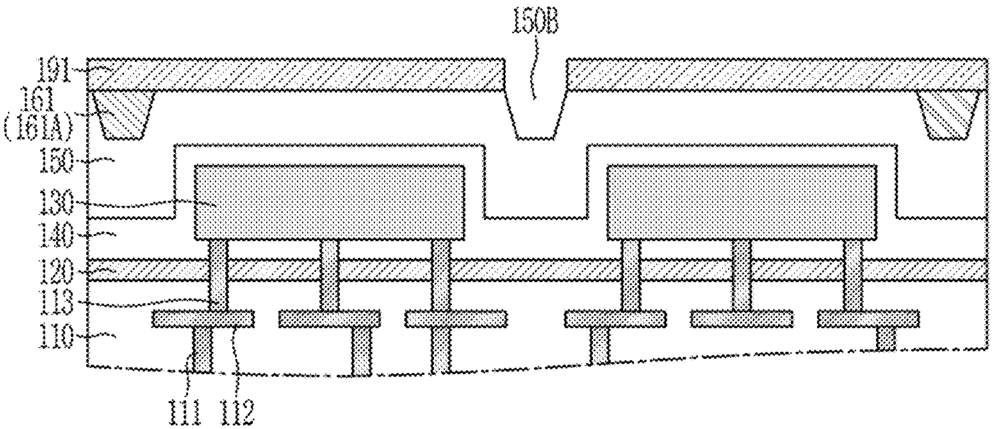

FIG. 13 is a cross-sectional view illustrating a step of etching some parts of the first protective insulating layer 150.

Referring to FIG. 13, the first protective insulating layer 150 may be etched using the photoresist (191) pattern as an etch mask, such that recesses 150B are formed in the first protective insulating layer 150.

Figure 14:
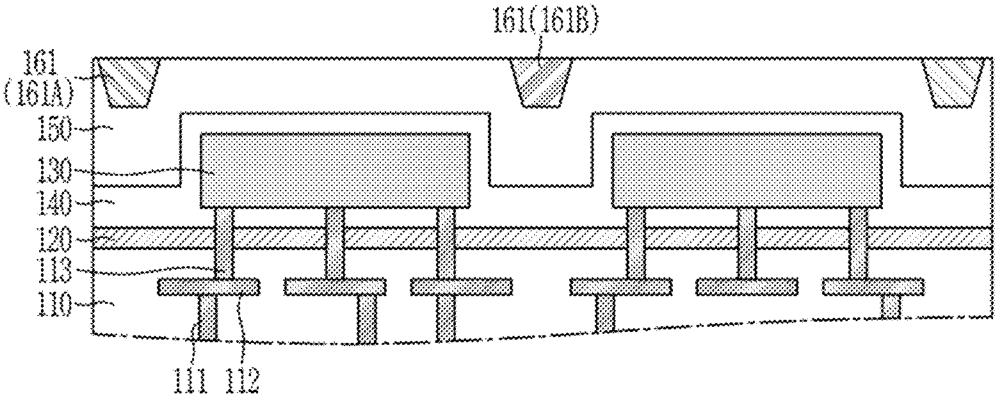

FIG. 14 is a cross-sectional view illustrating a step of depositing the second material 161B in the recesses 150B formed in the first protective insulating layer 150 and removing the photoresist 191.

Referring to FIG. 14, the warpage value of the wafer measured at the position where the recesses 150B are formed in the first protective insulating layer 150 may be negative. At this position, the wafer may exhibit a warpage property of warping downward. In an embodiment, the second material 161B may be low compressive silicon nitride. The low compressive silicon nitride may be formed by decreasing the flow rates of reaction gases $SiH_4$ and $NH_3$ or reaction gases $SiH_2Cl_2$ and $NH_3$ in a chamber and decreasing the pressure in the chamber. If the flow rates of the reaction gases are decreased and the pressure in the chamber is decreased, when the low compressive silicon nitride is formed, spacing between molecules, which may be affected by the N—H bonds and the Si—H bonds, may be increased. As a result, the tensile residual stress and density of the silicon nitride may be significantly decreased, and the low compressive silicon nitride may be formed.

In another embodiment, the second material 161B may be low compressive silicon oxide. In this case, the low compressive silicon oxide may be formed by decreasing the flow rates of reaction gases TEOS and $O_2$ in a chamber and decreasing the pressure in the chamber. As a result, the tensile residual stress of the low compressive silicon oxide may be significantly decreased.

Since the tensile residual stress of the low compressive silicon nitride or the low compressive silicon oxide may be increased in the positive direction, the low compressive silicon nitride or the low compressive silicon oxide may have a warpage property of warping upward, that is, a positive warpage value. By including the patterns of the low compressive silicon nitride or the low compressive silicon oxide at one or more of the positions of the wafer where the warpage value is negative, the warpage property of the wafer can be adjusted.

The photoresist (191) pattern may be removed from the first protective insulating layer 150 by ashing and stripping. The photoresist (191) pattern may be removed following the formation of the second material 161B.

Excess second material 161B on the first protective insulating layer 150 may be removed and planarized, for example, by applying a CMP process or a mechanical grinding process. For example, the upper surfaces of the first material 161A, the second material 161B, and the first protective insulating layer 150 may be coplanar following a planarization.

Figure 15:
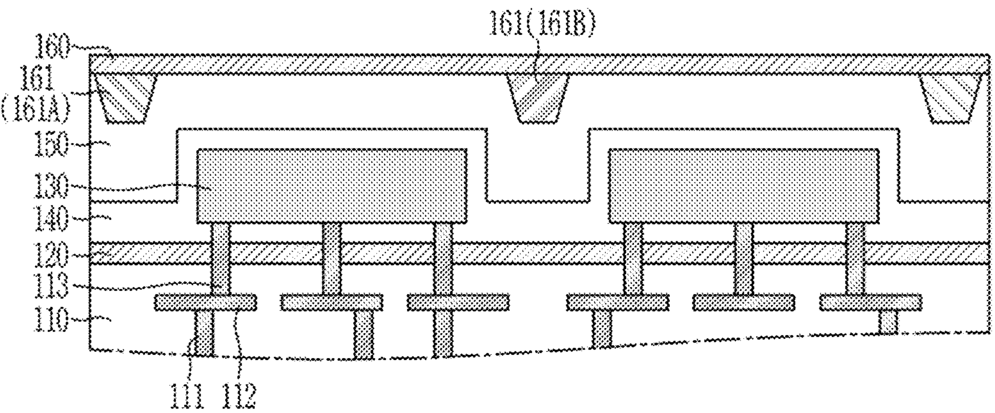

FIG. 15 is a cross-sectional view illustrating a step of depositing the second protective insulating layer 160 on the first material 161A, the second material 161B, and the first protective insulating layer 150.

Referring to FIG. 15, the second protective insulating layer 160 may be formed on the first material 161A, the second material 161B, and the first protective insulating layer 150. In an embodiment, the second protective insulating layer 160 may be formed by, for example, an atomic layer deposition (ALD) process, a chemical vapor deposition (CVD) process, etc.

Subsequently, the bump structures may be formed on the second protective insulating layer 160 (see FIG. 2).

FIG. 16 to FIG. 25 are cross-sectional views illustrating a method for manufacturing the semiconductor device of an embodiment of FIG. 3.

Figure 16:
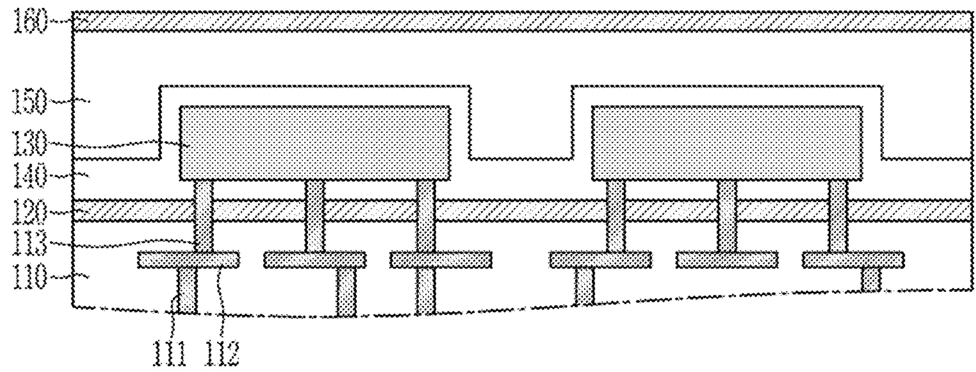
FIG. 16, FIG. 17, FIG. 18, FIG. 19, FIG. 20, FIG. 21, FIG. 22, FIG. 23, FIG. 24, and FIG. 25 are cross-sectional views illustrating a method for manufacturing the semiconductor device of an embodiment of FIG. 3.

FIG. 16 is a cross-sectional view illustrating a step of depositing the second protective insulating layer 160 on the first protective insulating layer 150.

Referring to FIG. 16, the second protective insulating layer 160 may be formed on the first protective insulating layer 150. In an embodiment, the second protective insulating layer 160 may be formed by, for example, an atomic layer deposition (ALD) process, a chemical vapor deposition (CVD) process, etc.

Figure 17:
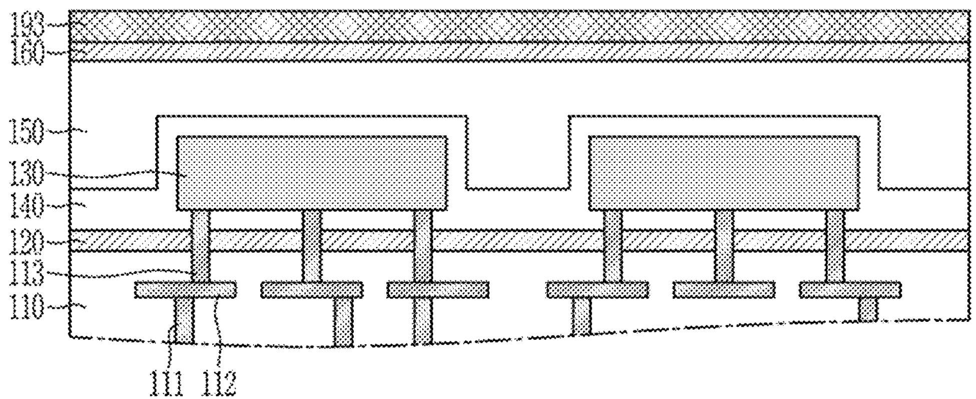

FIG. 17 is a cross-sectional view illustrating a step of coating the upper surface of the second protective insulating layer 160 with a photoresist 193.

Referring to FIG. 17, the upper surface of the second protective insulating layer 160 may be coated with the photoresist 193. In an embodiment, the photoresist 193 may be formed by spin coating, for example. In an embodiment, the photoresist 193 may comprise an organic polymer resin containing a photoactive material.

Figure 18:
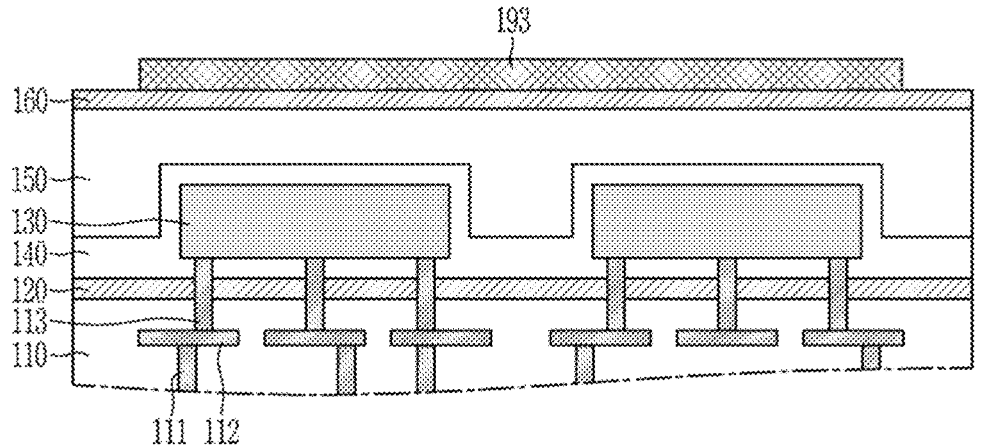

FIG. 18 is a cross-sectional view illustrating a step of patterning the photoresist 193.

Referring to FIG. 18, the photoresist 193 may be patterned by exposing and developing the photoresist 193 in view of the warpage value of the wafer.

Figure 19:
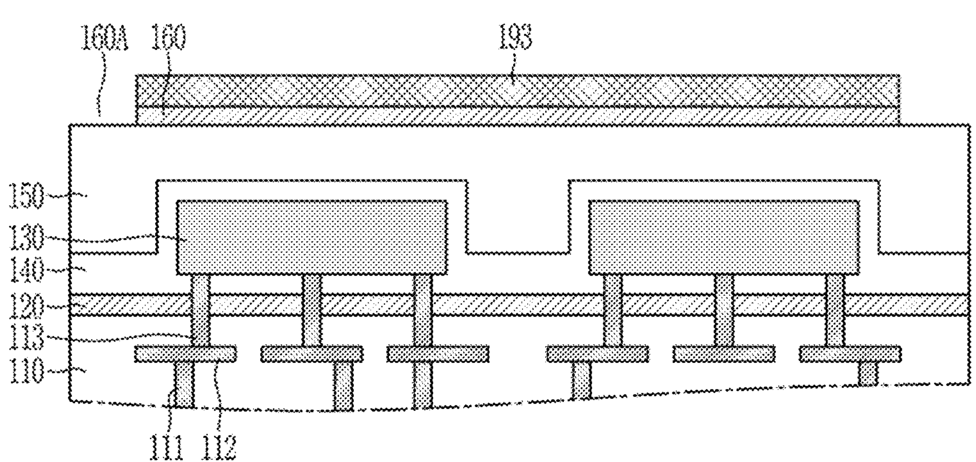

FIG. 19 is a cross-sectional view illustrating a step of etching some parts of the second protective insulating layer 160.

Referring to FIG. 19, the second protective insulating layer 160 may be etched using the photoresist (193) pattern as an etch mask. The second protective insulating layer 160 may be patterned such that recesses 160A are formed in the second protective insulating layer 160.

Figure 20:
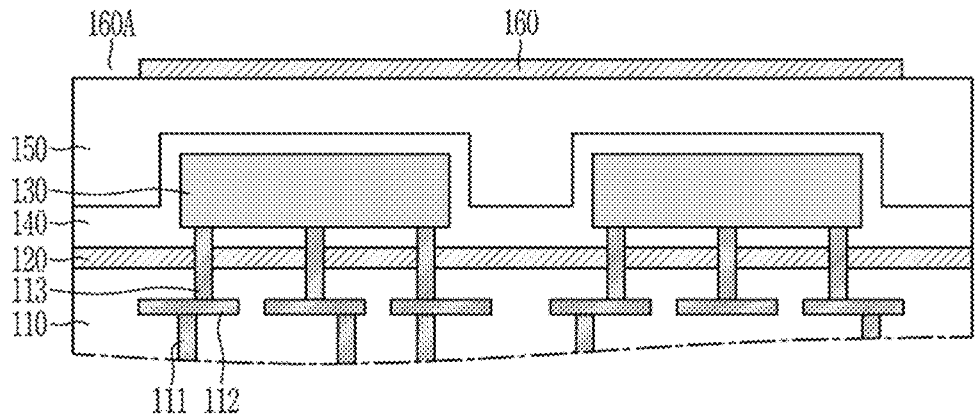

FIG. 20 is a cross-sectional view illustrating a step of removing the photoresist (193) pattern.

Referring to FIG. 20. the photoresist (193) pattern may be removed from the second protective insulating layer 160 by ashing and stripping.

Figure 21:
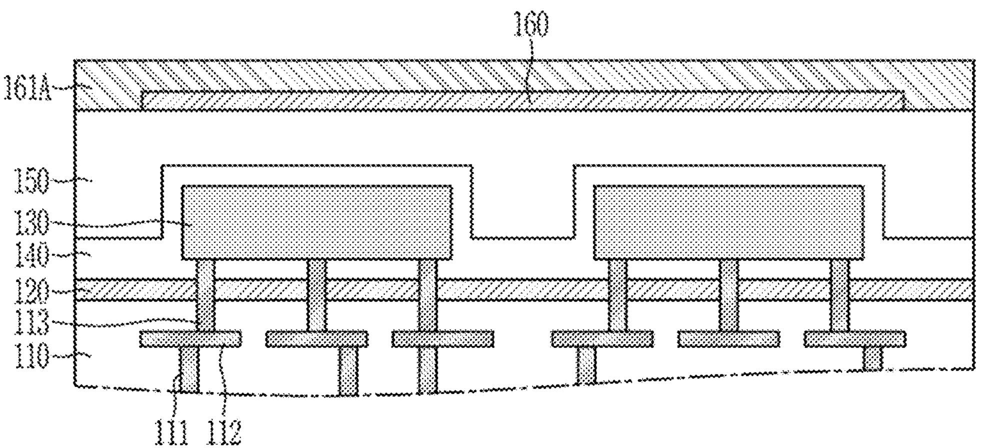

FIG. 21 is a cross-sectional view illustrating a step of depositing the first material 161A in the recesses 160A formed in the second protective insulating layer 160.

Referring to FIG. 21, the warpage value of the wafer measured at the positions where the recesses 160A are formed in the second protective insulating layer 160 may be positive. The formation of the first material 161A is described herein, for example, with reference to FIG. 10.

Figure 22:
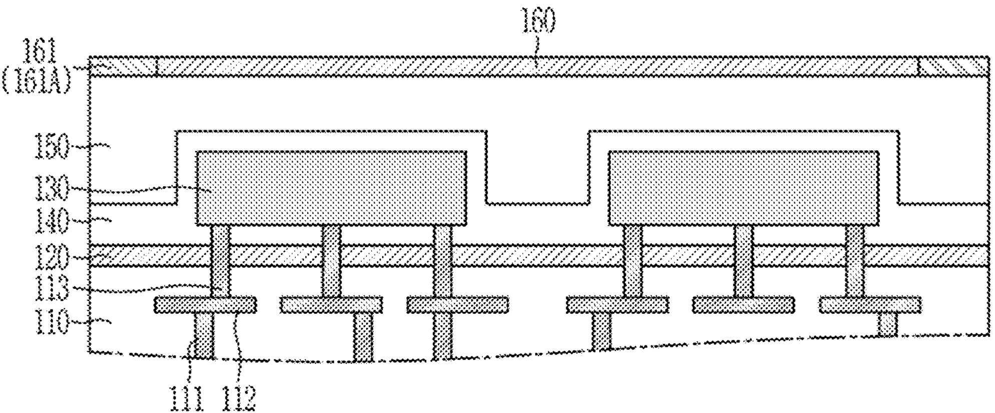

FIG. 22 is a cross-sectional view illustrating a step of performing a chemical mechanical planarization (CMP) process on the first material 161A.

Referring to FIG. 22, the excess first material 161A on the second protective insulating layer 160 may be removed and planarized, for example, by applying a CMP process or a mechanical grinding process. Upper surfaces of the first material 161A and the second protective insulating layer 160 may be coplanar following planarization.

Figure 23:
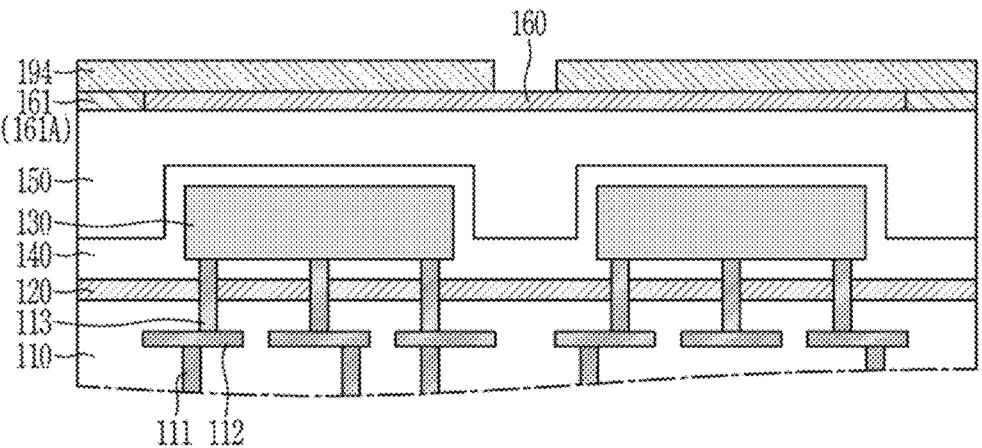

FIG. 23 is a cross-sectional view illustrating a step of coating the upper surface of the second protective insulating layer 160 with a photoresist 194 and patterning the photoresist.

Referring to FIG. 23, the upper surface of the second protective insulating layer 160 may be coated with the photoresist 194. For example, the upper surfaces of the second protective insulating layer 160 and the first material 161A may be coated with the photoresist 194. The photoresist 194 may be patterned by exposing and developing the photoresist 194. The photoresist 194 may be patterned in view of the warpage value of the wafer. In an embodiment, the photoresist 194 may be formed by spin coating, for example. In an embodiment, the photoresist 194 may comprise an organic polymer resin containing a photoactive material . . .

Figure 24:
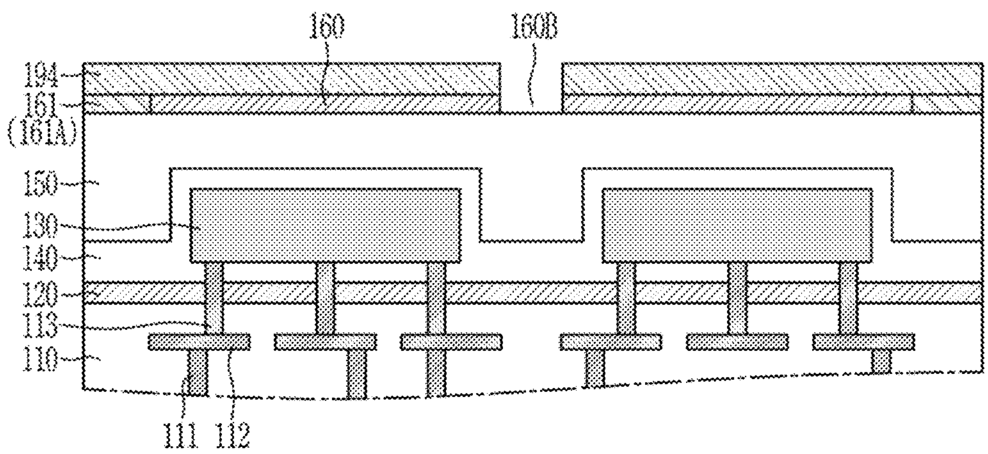

FIG. 24 is a cross-sectional view illustrating a step of etching some parts of the second protective insulating layer 160.

Referring to FIG. 24, the second protective insulating layer 160 may be etched using the photoresist (194) pattern as an etch mask, such that recesses 160B are formed in the second protective insulating layer 160.

Figure 25:
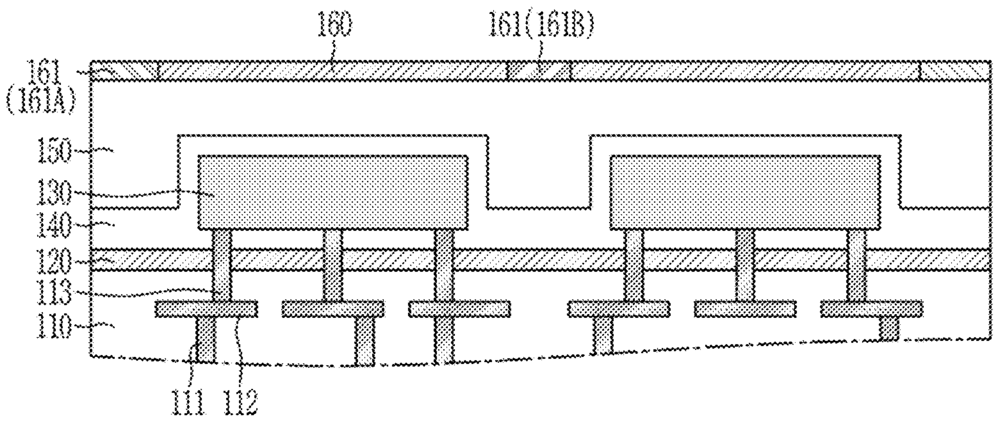

FIG. 25 is a cross-sectional view illustrating a step of depositing the second material 161B in the recesses 160B formed in the second protective insulating layer 160 and removing the photoresist (194) pattern.

Referring to FIG. 25, the warpage value of the wafer measured at the position where the recesses 160B are formed in the second protective insulating layer 160 may be negative. The formation of the second material 161B is described herein, for example, with reference to FIG. 14.

Excess second material 161B on the first protective insulating layer 150 may be removed and planarized, for example, by applying a CMP process or a mechanical grinding process. For example, the upper surfaces of the first material 161A, the second material 161B, and the second protective insulating layer 160 may be coplanar following a planarization.

Subsequently, the bump structures may be formed on the second protective insulating layer 160 on the second protective insulating layer 160 (see FIG. 3).

While this invention has been described in connection with what is presently considered to be practical embodiments, it is to be understood that the invention is not limited to disclosed embodiments. On the contrary, it is intended to cover various modifications and equivalent arrangements included within the spirit and scope of the appended claims.

What is claimed is:

1. A semiconductor device comprising:

an interlayer insulating layer;

a first protective insulating layer on the interlayer insulating layer;

a second protective insulating layer on the first protective insulating layer; and a plurality of insulating structures disposed in at least one of the first protective insulating layer or the second protective insulating layer, wherein the plurality of insulating structures comprise:

a first insulating structure comprising a first material having a first physical property; and a second insulating structure comprising a second material having a second physical property, wherein the first material and the second material comprise a same material, and the first physical property and the second physical property are different physical properties.

2. The semiconductor device of claim 1, wherein the interlayer insulating layer is on a substrate.

3. The semiconductor device of claim 1, wherein the first material has a tensile residual stress greater than a tensile residual stress of the second material.

4. The semiconductor device of claim 1, wherein the first material has a density greater than a density of the second material.

5. The semiconductor device of claim 1, wherein the first material and the second material comprise a silicon nitride or a silicon oxide.

6. The semiconductor device of claim 1, wherein the plurality of insulating structures are disposed in the first protective insulating layer and extend from a lower surface of the second protective insulating layer.

7. The semiconductor device of claim 1, wherein the plurality of insulating structures are disposed in the second protective insulating layer and have a same thickness as a thickness of the second protective insulating layer.

8. A semiconductor device comprising:

a substrate;

an interlayer insulating layer on the substrate;

a plurality of wiring lines disposed in the interlayer insulating layer;

a mask layer on the interlayer insulating layer;

a conductive pad in the mask layer;

a plurality of contact plugs connecting the plurality of wiring lines and the conductive pad;

a first protective insulating layer on the mask layer;

a second protective insulating layer on the first protective insulating layer;

a plurality of insulating structures disposed in at least one of the first protective insulating layer or the second protective insulating layer; and a bump structure on the second protective insulating layer, wherein the plurality of insulating structures comprise:

a first insulating structure comprising a first material having a first physical property; and a second insulating structure comprising a second material having a second physical property, wherein the first material and the second material comprise a same material and the first physical property and the second physical property are different physical properties, and a thickness of the conductive pad is greater than a thickness of each wiring line of the plurality of wiring lines, and the bump structure is in contact with the conductive pad through the first protective insulating layer and the second protective insulating layer.

9. The semiconductor device of claim 8, wherein the thickness of the conductive pad is between about two to 100 times the thickness of the plurality of wiring lines, and the thickness of the conductive pad is between about 1 μm to 5 μm.

10. The semiconductor device of claim 8, wherein at least one of the mask layer or the first protective insulating layer comprises tetraethyl orthosilicate (TEOS).

11. The semiconductor device of claim 8, wherein the second protective insulating layer comprises a silicon nitride.

12. The semiconductor device of claim 8, wherein the conductive pad comprises aluminum, and the plurality of wiring lines comprises copper.

13. The semiconductor device of claim 8, wherein in a plan view, the first insulating structure and the second insulating structure have shapes surrounding at least a portion of a periphery of the conductive pad.

14. The semiconductor device of claim 8, wherein the first material has a tensile residual stress greater than a tensile residual stress of the second material.

15. The semiconductor device of claim 8, the first material and the second material comprise a silicon nitride or a silicon oxide.

* * * * *